United States Patent
Kishimoto

(10) Patent No.: US 10,530,333 B2
(45) Date of Patent: Jan. 7, 2020

(54) ACOUSTIC WAVE DEVICE AND MANUFACTURING METHOD FOR SAME

(71) Applicant: Murata Manufacturing Co., Ltd., Nagaokakyo-shi, Kyoto-fu (JP)

(72) Inventor: Yutaka Kishimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 345 days.

(21) Appl. No.: 15/604,738

(22) Filed: May 25, 2017

(65) Prior Publication Data

US 2017/0264266 A1 Sep. 14, 2017

Related U.S. Application Data

(63) Continuation of application No. PCT/JP2015/081162, filed on Nov. 5, 2015.

(30) Foreign Application Priority Data

Dec. 25, 2014 (JP) ................................. 2014-262202

(51) Int. Cl.
*H03H 9/25* (2006.01)
*H01L 41/09* (2006.01)
(Continued)

(52) U.S. Cl.
CPC ............... *H03H 9/25* (2013.01); *H03H 3/08* (2013.01); *H03H 9/02984* (2013.01); *H03H 9/1085* (2013.01)

(58) Field of Classification Search
CPC ........ H03H 9/25; H03H 3/08; H03H 9/02984; H03H 9/1085
(Continued)

(56) References Cited

U.S. PATENT DOCUMENTS

2006/0158062 A1* 7/2006 Aoki .................. H03H 3/08
310/313 B
2007/0058003 A1* 3/2007 Aoki .................... H03H 9/0547
347/68

(Continued)

FOREIGN PATENT DOCUMENTS

JP 2008-252351 A 10/2008
WO 2009/001650 A1 12/2008
(Continued)

OTHER PUBLICATIONS

Official Communication issued in International Patent Application No. PCT/JP2015/081162, dated Dec. 8, 2015.

*Primary Examiner* — Thomas M Dougherty
(74) *Attorney, Agent, or Firm* — Keating & Bennett, LLP

(57) ABSTRACT

An acoustic wave device that utilizes a plate wave includes a recess in an upper surface of a support substrate. A piezoelectric substrate is located on the support substrate with a first principal surface side facing the support substrate. An IDT electrode is provided on the first principal surface of the piezoelectric substrate. The recess defines a cavity that is surrounded by the support substrate and the first principal surface of the piezoelectric substrate. The IDT electrode faces the cavity. The piezoelectric substrate includes through-holes that communicate the cavity and the second principal surface with each other. Sealing materials are filled respectively in the through-holes.

13 Claims, 7 Drawing Sheets

(51) Int. Cl.
*H03H 3/08* (2006.01)
*H03H 9/02* (2006.01)
*H03H 9/10* (2006.01)

(58) Field of Classification Search
USPC .................. 310/313 A–313 D, 313 R, 324; 333/193–196
See application file for complete search history.

(56) References Cited

U.S. PATENT DOCUMENTS

| 2010/0244625 A1 | 9/2010 | Fukano et al. |
| 2011/0266918 A1 | 11/2011 | Iwamoto et al. |
| 2012/0205754 A1 | 8/2012 | Iwamoto |
| 2014/0152145 A1 | 6/2014 | Kando et al. |

FOREIGN PATENT DOCUMENTS

| WO | 2010/082571 A1 | 7/2010 |
| WO | 2011/052551 A1 | 5/2011 |
| WO | 2012/073871 A1 | 6/2012 |

\* cited by examiner

ACOUSTIC WAVE DEVICE AND MANUFACTURING METHOD FOR SAME

CROSS REFERENCE TO RELATED APPLICATIONS

This application claims the benefit of priority to Japanese Patent Application No. 2014-262202 filed on Dec. 25, 2014 and is a Continuation Application of PCT Application No. PCT/JP2015/081162 filed on Nov. 5, 2015. The entire contents of each application are hereby incorporated herein by reference.

BACKGROUND OF THE INVENTION

1. Field of the Invention

The present invention relates to an acoustic wave device, and more specifically to an acoustic wave device including a cavity provided between a support substrate and a piezoelectric substrate, and to a manufacturing method for the acoustic wave device.

2. Description of the Related Art

International Publication No. WO2010/082571 discloses an acoustic wave device utilizing a plate wave. In manufacturing this acoustic wave device, a multilayer body is prepared in which a sacrificial layer is formed in a recess in an upper surface of a support substrate and a piezoelectric single-crystal substrate is laminated in a state covering the sacrificial layer. In the multilayer body, an interdigital transducer (IDT) electrode is previously formed on a surface of the piezoelectric substrate, the surface facing the sacrificial layer. At least one through-hole is formed in the piezoelectric substrate to be communicated with the sacrificial layer. The sacrificial layer is removed by etching via the through-hole. As a result, a space occupied so far by the sacrificial layer is formed as a cavity. The IDT electrode provided on the piezoelectric substrate is positioned facing the cavity.

In the acoustic wave device disclosed in International Publication No. WO2010/082571, the through-hole is formed in order to remove the sacrificial layer. Therefore, the IDT electrode is apt to contact with open air via the through-hole. This causes a problem that weather resistance of the IDT electrode reduces, namely that deformation, color change, degradation, and so on of the IDT electrode occur.

SUMMARY OF THE INVENTION

Preferred embodiments of the present invention provide acoustic wave devices that increase weather resistance of an IDT electrode, and manufacturing methods for the acoustic wave devices.

An acoustic wave device according to a preferred embodiment of the present invention includes a support substrate including a recess provided in an upper surface, a piezoelectric substrate including a first principal surface and a second principal surface opposing to the first principal surface, the piezoelectric substrate being located on the support substrate with the first principal surface side facing the support substrate, and an IDT electrode provided on the first principal surface, wherein the recess defines a cavity that is surrounded by the support substrate and the first principal surface, the IDT electrode is positioned facing the cavity, the piezoelectric substrate includes at least one through-hole that communicates the cavity and the second principal surface with each other, and a sealing material is filled in the through-hole.

In an acoustic wave device according to one particular preferred embodiment of the present invention, the sealing material is a metal material or a resin material. In such a case, permeation of water vapor is effectively reduced or prevented. As a result, weather resistance of the IDT electrode is more effectively increased.

Preferably, a material containing copper as a main component is used as the metal material. In such a case, because it is easy to handle the sealing material and to fill the sealing material into the through-hole, the manufacturing cost is reduced.

Preferably, a photosensitive resin is used as the resin material. In such a case, the photosensitive resin is easily cured. Accordingly, a manufacturing process is simplified, and the manufacturing cost is reduced.

Preferably, photosensitive polyimide is used as the photosensitive resin. In such a case, water vapor has a difficult time permeating through the photosensitive polyimide, and manufacturing is facilitated. Therefore, the manufacturing cost is reduced while the weather resistance of the IDT electrode is further increased.

According to another particular preferred embodiment of the present invention, an acoustic wave device further includes a protective film that is disposed on the first principal surface of the piezoelectric substrate in a state covering the IDT electrode. In such a case, the weather resistance of the IDT electrode is more effectively increased.

The protective film is preferably made of at least one material selected from a group consisting of silicon oxide, a material containing silicon oxide as a main component, silicon nitride, a material containing silicon nitride as a main component, silicon oxynitride, and a material containing silicon oxynitride as a main component. In the case of using one of those materials, permeation of water vapor is more effectively reduced or prevented. Accordingly, the weather resistance of the IDT electrode is more effectively increased. In addition, frequency-temperature characteristics of the acoustic wave device is also improved.

According to still another particular preferred embodiment of the present invention, an acoustic wave device further includes a characteristics adjustment film that is disposed on the second principal surface of the piezoelectric substrate to adjust characteristics of the acoustic wave device. In such a case, resonance characteristics, filter characteristics, etc. of the acoustic wave device are adjusted.

The characteristics adjustment film is preferably made of at least one material selected from a group consisting of: silicon oxide, a material containing silicon oxide as a main component, silicon nitride, a material containing silicon nitride as a main component, silicon oxynitride, and a material containing silicon oxynitride as a main component. Frequency-temperature characteristics, etc. are improved by using at least one of the above-mentioned materials.

Preferably, a main component of the characteristics adjustment film is the same as a main component of the protective film. In such a case, symmetry between a structure on one side of the piezoelectric substrate and a structure on the other side is increased. Accordingly, excitation efficiency of the plate wave is increased. More preferably, a composition of the characteristics adjustment film preferably is the same or substantially the same as a composition of the protective film.

A manufacturing method for an acoustic wave device according to a preferred embodiment of the present invention includes the steps of providing an IDT electrode on a first principal surface of a piezoelectric substrate, providing a sacrificial layer on the first principal surface in a state covering the IDT electrode, forming a support substrate in a state covering the sacrificial layer, forming, in the piezoelectric substrate, at least one through-hole that extends from a second principal surface of the piezoelectric substrate up to the sacrificial layer, removing the sacrificial layer by etching via the through-hole, thus forming a cavity in a portion having been occupied by the sacrificial layer, and filling a sealing material into the through-hole.

With the acoustic wave devices and the manufacturing methods for the acoustic wave device according to preferred embodiments of the present invention, since the sealing material is filled in the through-hole, weather resistance of the IDT electrode is effectively increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of example preferred embodiments of the present invention with reference to the drawings.

It is to be noted that the preferred embodiments explained in this description are merely illustrative, and that individual components used in the different preferred embodiments is partly exchanged or combined on an optional basis as desired.

Figure 1:
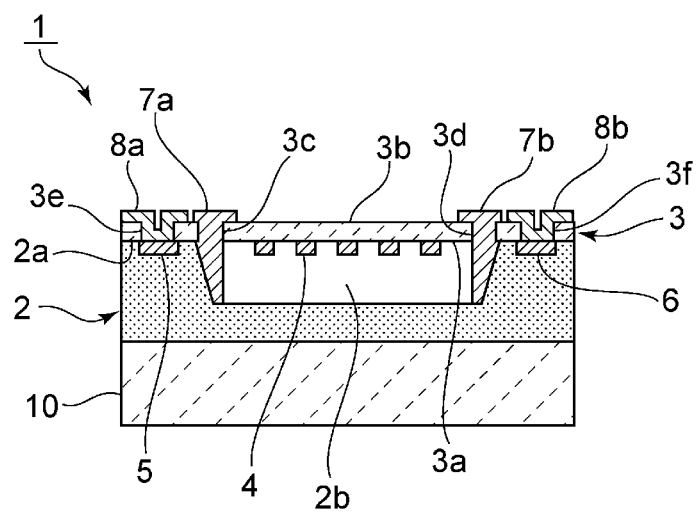
FIG. 1 is a front sectional view of an acoustic wave device according to a first preferred embodiment of the present invention.

FIG. 1 is a front sectional view of an acoustic wave device according to a first preferred embodiment of the present invention. An acoustic wave device 1 includes a support substrate 2. A reinforcing substrate 10 is laminated on a lower surface of the support substrate 2.

The support substrate 2 and the reinforcing substrate 10 are each made of an appropriate electrically insulating material or semiconductor material. Examples of such an electrically insulating material include alumina, silicon oxide, silicon nitride, silicon oxynitride, and silicon.

A recess 2b is provided in an upper surface 2a of the support substrate 2. A piezoelectric substrate 3 is laminated on the upper surface 2a of the support substrate 2. The piezoelectric substrate 3 includes a first principal surface 3a and a second principal surface 3b that are opposed to each other. An IDT electrode 4 is provided on the first principal surface 3a. Electrode lands 5 and 6 are electrically connected to the IDT electrode 4.

The piezoelectric substrate 3 is preferably made of a piezoelectric single crystal, such as, for example, LiTaO$_3$ or LiNbO$_3$. The piezoelectric substrate 3 may be made of piezoelectric ceramics.

The piezoelectric substrate 3 is disposed in a state covering the recess 2b. Therefore, the recess 2b defines a cavity that is surrounded by the support substrate 2 and the piezoelectric substrate 3. The IDT electrode 4 is provided facing the cavity. Accordingly, when an alternate electric field is applied to the IDT electrode 4, a portion of the piezoelectric substrate where the IDT electrode 4 is provided is excited. The acoustic wave device 1 utilizes a plate wave excited by the IDT electrode 4.

The IDT electrode 4 and the electrode lands 5 and 6 are each made of an appropriate metal or alloy. Alternatively, the IDT electrode 4 and the electrode lands 5 and 6 may be each made of a multilayer metal film that is formed by laminating a plurality of metal films.

First through-holes 3c and 3d are provided in the piezoelectric substrate 3. The first through-holes 3c and 3d penetrate the piezoelectric substrate 3 from the first principal surface 3a to the second principal surface 3b. The first through-holes 3c and 3d are preferably utilized as etching holes in a manufacturing process described later. Shapes of openings of the first through-holes 3c and 3d in plan views are not limited to particular one. The openings may have appropriate shapes in plan views, such as being circular, rectangular, strip-shaped, or curved.

The first through-holes 3c and 3d provide communication between the cavity defined by the recess 2b and open air (i.e., a space in contact with the second principal surface 3b).

Sealing materials 7a and 7b are filled respectively in the first through-holes 3c and 3d. In this preferred embodiment, the sealing materials 7a and 7b are preferably made of metal materials.

The sealing materials 7a and 7b are applied in such a state of not only being filled in the first through-holes 3c and 3d, but also extending over the second principal surface 3b of the piezoelectric substrate 3 up to the outer sides of opening edges of the first through-holes 3c and 3d. Accordingly, communication of the cavity with the open air is more positively cut off.

The sealing materials 7a and 7b prevent the IDT electrode 4 from coming into contact with the open air via the first through-holes 3c and 3d. Thus, the sealing materials 7a and 7b are just required to be filled (poured) in the first through-holes 3c and 3d in a state of preventing contact of the IDT electrode 4 with the open air. In one example, the sealing materials 7a and 7b may not be completely filled in the first through-holes 3c and 3d. In such a case, the sealing materials 7a and 7b may be partly filled in the sealing materials 7a and 7b to define, for example, covers or the like that cut off the communication of the first through-holes 3c and 3d with the open air. Thus, the word "fill" is used here to represent a state that the sealing materials 7a and 7b are poured respectively in the first through-holes 3c and 3d in a fashion to reduce an opportunity of the IDT electrode 4 to come into contact with the open air.

Furthermore, the sealing materials 7a and 7b preferably extend up to the interior of the recess 2b beyond the first through-holes 3c and 3d. As an alternative, the sealing materials 7a and 7b may be poured in a state which does not extend up to the interior of the recess 2b.

Figure 5:
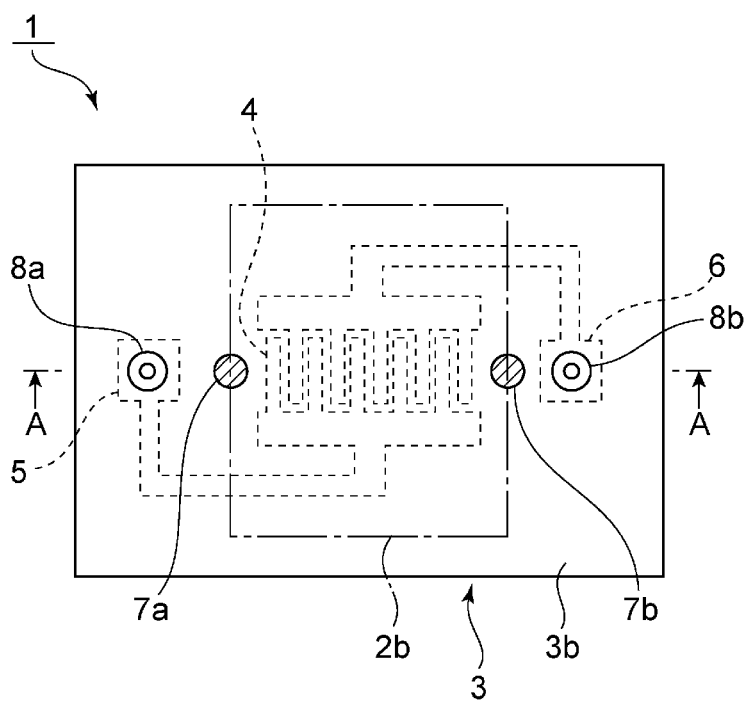
FIG. 5 is a schematic plan view of the acoustic wave device according to the first preferred embodiment of the present invention.

FIG. 5 is a schematic plan view of the acoustic wave device 1. A one-dot-chain line in FIG. 5 denotes a region where the recess 2b is defined.

In the acoustic wave device 1, the first through-holes 3c and 3d are preferably sealed respectively by the sealing materials 7a and 7b. Stated in another way, the IDT electrode 4 is positioned inside the sealed cavity. Accordingly, the contact of the IDT electrode 4 with the open air is reduced or prevented. As a result, weather resistance of the IDT electrode 4 is increased.

Materials of the sealing materials 7a and 7b are not limited to particular ones, but they are preferably metal materials that are less permeable to water vapor. The reason is that those metal materials are able to more effectively suppress degradation of the weather resistance of the IDT electrode 4. From that point of view, copper is preferable because copper is less permeable to water vapor and copper is relatively inexpensive and is easy to handle. Thus, when copper is used as the metal material of the sealing materials 7a and 7b, the manufacturing cost is reduced while the weather resistance is increased.

In another preferred embodiment, photosensitive polyimide may be used as the sealing materials 7a and 7b. When the sealing materials 7a and 7b are made of a resin material such as photosensitive polyimide, the resin material in a molten state or a softened state is easily filled into the first through-holes 3c and 3d. Hence the manufacturing is facilitated.

Moreover, in the case of using photosensitive resin, since patterning and curing is easily performed with light irradiation and heating, the first through-holes 3c and 3d is easily and reliably sealed. Moreover, in the case of using photosensitive polyimide, because of less permeability to water vapor, the weather resistance of the IDT electrode 4 is further increased.

It is to be noted that other metals, such as, for example, titanium and solder, than copper, an alloy, and a multilayer body of those materials may also be used if so desired.

Second through-holes 3e and 3f are preferably further provided in the piezoelectric substrate 3 on the outer side of the region where the recess 2b is provided. The second through-holes 3e and 3f are located facing the electrode lands 5 and 6, respectively. A vapor deposition film or a plating film is grown in each of the second through-holes 3e and 3f. In such a manner, second layer wirings 8a and 8b are preferably formed. Metal bumps or the likes may be joined to the second layer wirings 8a and 8b.

The second layer wirings 8a and 8b are preferably each made of an appropriate metal or alloy, such as, for example, Cu, Ni, an AlCu alloy, Al, or Ti. By providing the second layer wirings 8a and 8b, electrodes is led out from the interior of the substrate, and the device is easily mounted.

A manufacturing method for the acoustic wave device 1 according to the above preferred embodiment will be described below.

Figure 2A:
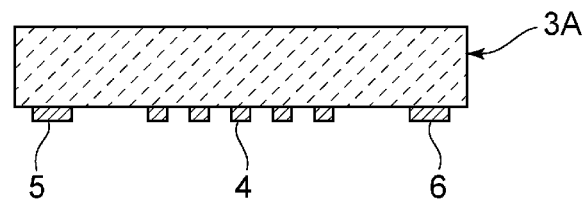
FIGS. 2A to 2C are front sectional views which explain a manufacturing process according to the first preferred embodiment of the present invention.

First, as illustrated in FIG. 2A, a piezoelectric substrate 3A is prepared as a blank to obtain the piezoelectric substrate 3. The IDT electrode 4 and the electrode lands 5 and 6 are formed on one principal surface of the piezoelectric substrate 3A.

In this preferred embodiment, a multilayer metal film of Ti/Al/Ti is preferably used as the IDT electrode 4. However, only Al may be used in another preferred embodiment including the IDT electrode 4.

A photolithography-liftoff process is preferably used in forming the IDT electrode 4 and the electrode lands 5 and 6. A film thickness of the IDT electrode 4 is about 10 nm or more and about 1000 nm or less, and a wavelength of the plate wave is about 1.5 µm or longer and about 10 µm or shorter, for example.

Figure 2B:
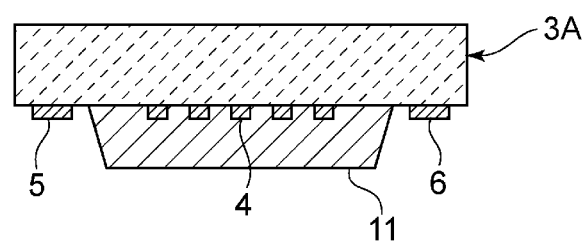

Next, as illustrated in FIG. 2B, a sacrificial layer 11 is preferably formed on the one principal surface of the piezoelectric substrate 3A by sputtering, for example, in a state covering the IDT electrode 4. The sacrificial layer 11 is made of an appropriate material that is removed by etching described later. Examples of such a material are ZnO and Cu.

Figure 2C:
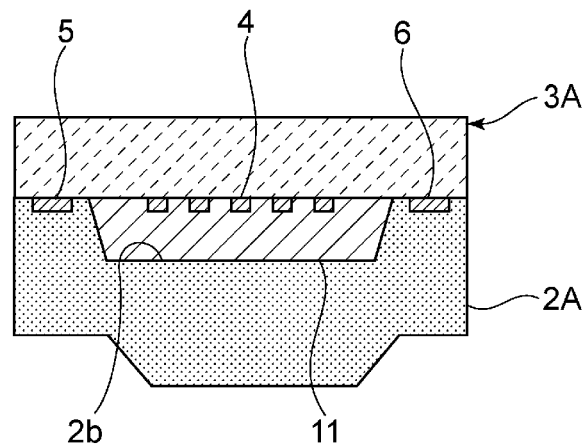

Next, as illustrated in FIG. 2C, a planarization film 2A that provides the support substrate is formed to cover the sacrificial layer 11. In this preferred embodiment, a $SiO_2$ film is preferably formed as the planarization film 2A.

Figure 3A:
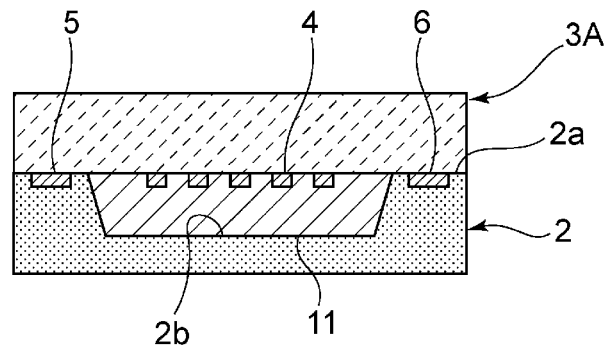
FIGS. 3A to 3C are front sectional views which explain the manufacturing process according to the first preferred embodiment of the present invention.

Next, planarization polishing is preferably performed with CMP (Chemical Mechanical Polishing). In such a manner, as illustrated in FIG. 3A, the support substrate 2 including the recess 2b in its upper surface is formed.

Figure 3B:
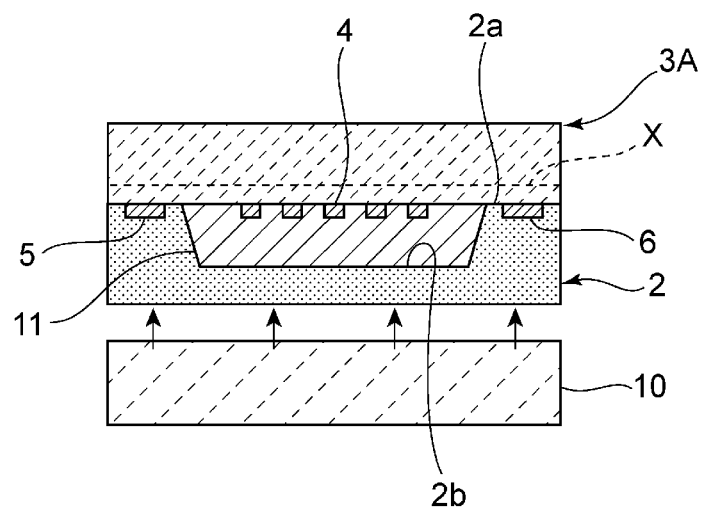
Figure 3C:
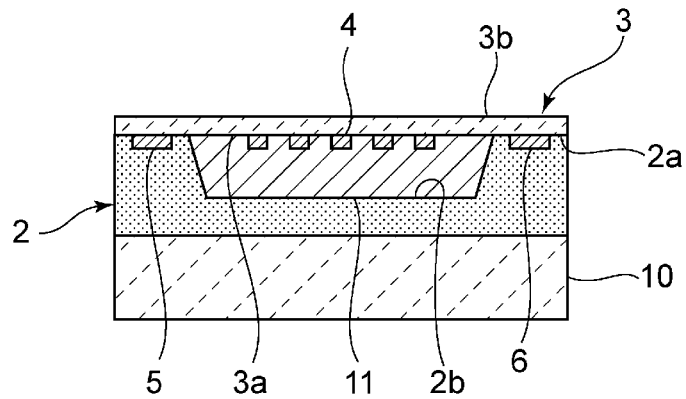

Next, as illustrated in FIG. 3B, the reinforcing substrate 10 is joined to a lower surface of the support substrate 2. Thereafter, the other principal surface (i.e., a surface on the opposite side to the surface where the IDT electrode 4 is provided) of the piezoelectric substrate 3A is polished with a polishing apparatus to such an extent that the piezoelectric substrate 3A is thinned to have a desired thickness, namely thinned up to reaching a line denoted by X in FIG. 3B. It is particularly desirable that the thickness of the piezoelectric substrate 3 after the above-described planarization is about 1000 nm or less, for example. As a result, a multilayer body illustrated in FIG. 3C is obtained. In the multilayer body, the recess 2b is provided in the upper surface of the support substrate 2, and the sacrificial layer 11 is filled in the recess 2b. Furthermore, the piezoelectric substrate 3 is laminated in a state covering the upper surface of the support substrate 2.

It is to be noted that the reinforcing substrate 10 is not always required. However, by providing the reinforcing substrate 10, a smoothing process of the piezoelectric substrate 3 is more easily performed.

Figure 4A:
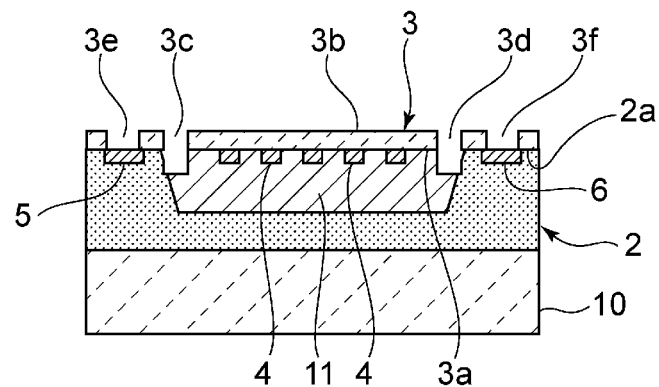
FIGS. 4A to 4C are front sectional views which explain the manufacturing process according to the first preferred embodiment of the present invention.

Next, as illustrated in FIG. 4A, the first through-holes 3c and 3d and the second through-holes 3e and 3f are preferably formed in the piezoelectric substrate 3 by laser irradiation or boring, for example. On that occasion, the first through-holes 3c and 3d are formed to reach up to the sacrificial layer 11.

Figure 4B:
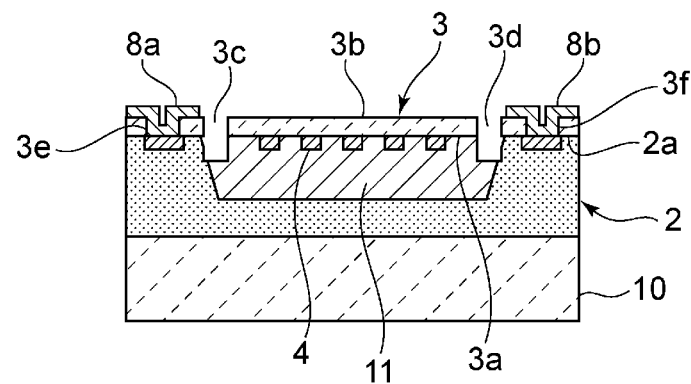

Next, as illustrated in FIG. 4B, the second layer wirings 8a and 8b are formed in the second through-holes 3e and 3f that are positioned facing the electrode lands 5 and 6, respectively. A method of forming the second layer wirings 8a and 8b is not limited to particular one. For example, a vapor-deposition—liftoff process or a plating process is used. In this preferred embodiment, a multilayer metal film of Al/Ti is preferably used as each of the second layer wirings 8a and 8b. Such a multilayer metal film is easily formed by the vapor-deposition—liftoff process. A thickness of each of the second layer wirings 8a and 8b is not limited to particular one, but it may be about 100 nm or more and about 2000 nm or less, for example.

Figure 4C:
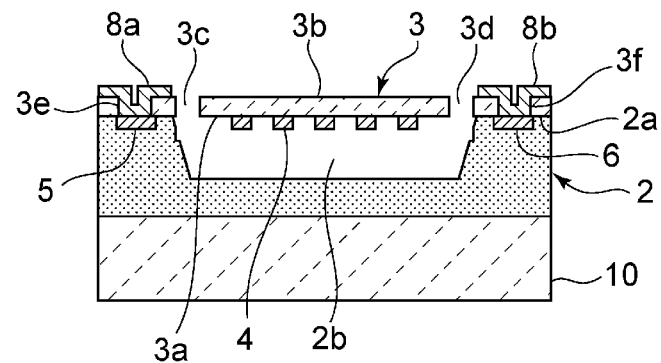

Next, the sacrificial layer 11 is removed using an etchant while the first through-holes 3c and 3d are used as etching holes. The etchant may be appropriately selected depending on the material of the sacrificial layer 11. When the sacrificial layer 11 is made of ZnO, for example, the etchant may be prepared as a mixture containing acetic acid, phosphoric acid, and water at a ratio of, e.g., about 1:1:10 by weight. With the etching described above, a structure illustrated in FIG. 4C is obtained. Thereafter, a metal material or a resin material is filled as the sealing material into the first through-holes 3c and 3d. As a result, the acoustic wave device 1 illustrated in FIG. 1 is obtained.

The filling of the sealing material into the first through-holes 3c and 3d is easily performed by pouring a conductive material, such as a Cu paste, or a resin material, such as photosensitive polyimide.

While an example preferably including two first through-holes has been described as the first preferred embodiment, the number of the first through-holes may be one or three or more. This is similarly applied to a later-described second preferred embodiment as well.

A manufacturing method and a structure of an acoustic wave device according to a second preferred embodiment of the present invention will be described below with reference to FIGS. 6A to 8.

Figure 6A:
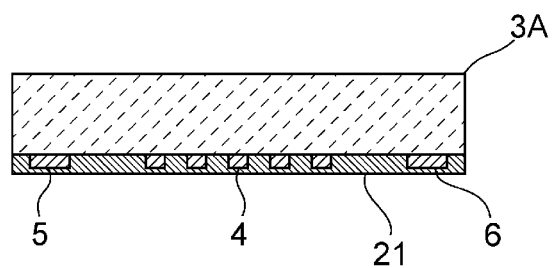
FIGS. 6A and 6B front sectional views which explain a manufacturing process for an acoustic wave device according to a second preferred embodiment of the present invention.

In the second preferred embodiment, as illustrated in FIG. 6A, the IDT electrode 4 and the electrode lands 5 and 6 are first formed on one principal surface of the piezoelectric substrate 3A. Then, a protective film 21 is formed to cover the IDT electrode 4. The protective film 21 may be made of an appropriate insulating material. With the formation of the protective film 21, the IDT electrode 4 is more reliably reduced or prevented from coming into contact with the open air. Hence the weather resistance of the IDT electrode 4 is further increased.

The protective film 21 is preferably made of at least one material selected from a group consisting of: silicon oxide, a material containing silicon oxide as a main component, silicon nitride, a material containing silicon nitride as a main component, silicon oxynitride, and a material containing silicon oxynitride as a main component. Furthermore, the protective film 21 may be a multilayer film of two or more types of materials. Alternatively, the protective film 21 may be a mixture of the above-mentioned insulating materials and the like.

Figure 6B:
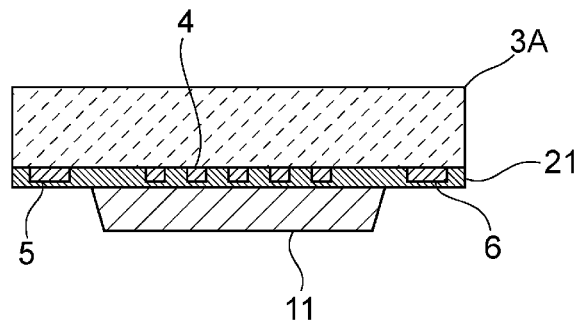

After forming the protective film 21, the sacrificial layer 11 is preferably formed as illustrated in FIG. 6B.

The second preferred embodiment is similar to the first preferred embodiment except for that the protective film 21 is disposed.

Thus, as in the first preferred embodiment, after forming the sacrificial layer 11, the planarization film 2A is formed, and the support substrate 2 is formed by polishing the planarization film 2A. Furthermore, after joining the reinforcing substrate 10 as illustrated in FIG. 3B, the piezoelectric substrate 3 is polished from the side opposite to the surface on which the IDT electrode 4 is formed, such that the piezoelectric substrate 3 having a reduced thickness is obtained.

In a manner described above, a multilayer body illustrated in FIG. 7A is obtained. In the multilayer body, the support substrate 2 is laminated on the reinforcing substrate 10, and the sacrificial layer 11 is filled in the recess 2b of the support substrate 2. Furthermore, the protective film 21 is disposed in a state covering the sacrificial layer 11. The piezoelectric substrate 3 is laminated on the protective film 21. In addition, the IDT electrode 4 and the electrode lands 5 and 6 are provided on the first principal surface 3a of the piezoelectric substrate 3.

Figure 7A:
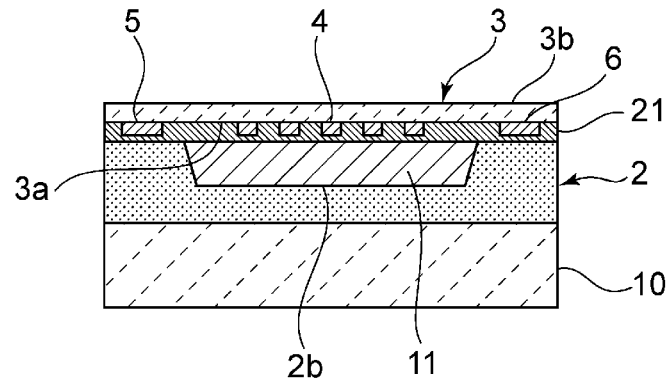
FIGS. 7A and 7B are front sectional views which explain the manufacturing process for the acoustic wave device according to the second preferred embodiment of the present invention.
Figure 7B:
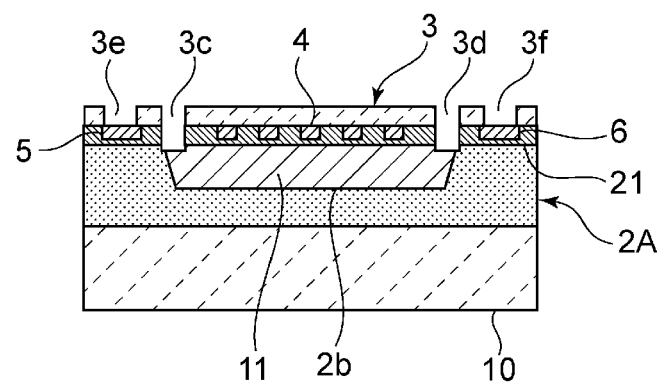

Next, as illustrated in FIG. 7B, the first through-holes 3c and 3d and the second through-holes 3e and 3f are preferably formed as in the first preferred embodiment.

Figure 8:
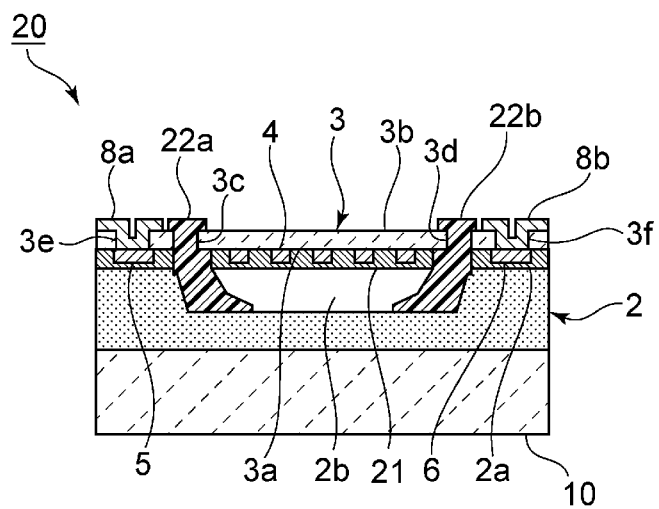
FIG. 8 is a front sectional view of the acoustic wave device according to the second preferred embodiment of the present invention.

Moreover, as illustrated in FIG. 8, the second layer wirings 8a and 8b are formed.

Sealing materials 22a and 22b are filled respectively into the first through-holes 3c and 3d. As in the first preferred embodiment, the sealing materials 22a and 22b may be each photosensitive polyimide or a metal material such as copper.

In an acoustic wave device 20 according to the second preferred embodiment, since the IDT electrode 4 is covered with the protective film 21 and the sealing materials 22a and 22b are filled respectively into the first through-holes 3c and 3d, the weather resistance of the IDT electrode 4 is more effectively increased.

Figure 9:
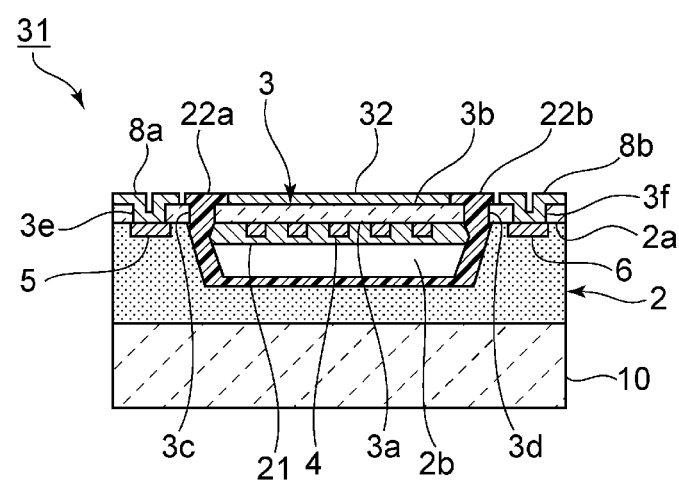
FIG. 9 is a front sectional view of an acoustic wave device according to a third preferred embodiment of the present invention.

FIG. 9 is a front sectional view of an acoustic wave device according to a third preferred embodiment. An acoustic wave device 31 according to the third preferred embodiment is preferably similar to the acoustic wave device 20 except for that, in addition to the protective film 21 provided on the lower surface of the piezoelectric substrate 3 in the acoustic wave device 20, a characteristics adjustment film 32 is laminated on the second principal surface 3b of the piezoelectric substrate 3.

The characteristics adjustment film 32 is disposed to adjust resonance characteristics and filter characteristics of the acoustic wave device 31. The characteristics adjustment film 32 is made of at least one material selected from a group consisting of: silicon oxide, a material containing silicon oxide as a main component, silicon nitride, a material containing silicon nitride as a main component, silicon oxynitride, and a material containing silicon oxynitride as a main component. Using at least one of those materials makes it possible to adjust characteristics of the acoustic wave device 31, such as frequency-temperature characteristics, and hence to adjust the resonance characteristics and the filter characteristics thereof.

It is particularly desirable that the main component of the characteristics adjustment film 32 is the same as the main component of the protective film 21. In such a case, symmetry between one side (including the protective film 21) of the piezoelectric substrate 3 and the other side (including the characteristics adjustment film 32) is increased. Accordingly, the resonance characteristics and the filter characteristics are realized at more satisfactory levels. More preferably, a composition of the characteristics adjustment film 32 is the same as that of the protective film 21.

The sealing materials 22a and 22b may extend up to a bottom surface of the recess 2b. As in this preferred embodiment, the sealing materials 22a and 22b may be coupled with each other. Alternatively, the sealing materials may be present only in the vicinity of the first through-holes 3c and 3d. Thus, it is preferable that the sealing materials are capable of shutting off the open air.

Preferred embodiments of the present invention provide acoustic wave devices including the cavity provided under the piezoelectric substrate 3 and utilizing a plate wave, the acoustic wave devices preferably including a structure in which the first through-holes 3c and 3d used as etching holes are sealed by the sealing materials. Thus, an electrode structure including the IDT electrode 4, which is provided on the first principal surface 3a of the piezoelectric substrate 3, is not limited to particular one. In other words, the electrode structure including the IDT electrode 4 is optionally provided in layouts defining various resonators, filters, and so on.

The acoustic wave devices of preferred embodiments of the present invention are widely used in a variety of electronic devices and communication devices. An example of the electronic devices is a sensor. Examples of the communication devices are a duplexer including at least one of the acoustic wave devices of various preferred embodiments of the present invention, and communication module devices including, in addition to the acoustic wave device of the present invention, a PA (Power Amplifier) and/or an LNA (Low Noise Amplifier) and/or a SW (Switch), as well as a mobile communication device and a healthcare communication device each including at least one of the above-described communication module devices. Examples of the mobile communication device are a cellular phone, a smartphone, and a car navigator. Examples of the healthcare communication device are a weight scale and a body fat scale. Each of the mobile communication device and the healthcare communication device preferably includes an antenna, an RF module, an LSI, a display, an input unit, a power supply, and so on.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a support substrate including a recess provided in an upper surface;
   a piezoelectric substrate including a first principal surface and a second principal surface opposed to the first principal surface, the piezoelectric substrate being located on the support substrate with the first principal surface side facing the support substrate; and
   an IDT electrode provided on the first principal surface; wherein
   the recess defines a cavity that is surrounded by the support substrate and the first principal surface;
   the IDT electrode faces the cavity;
   the piezoelectric substrate includes at least one through-hole that communicates the cavity and the second principal surface with each other; and
   a sealing material is filled in the at least one through-hole.

2. The acoustic wave device according to claim 1, wherein the sealing material includes a metal material or a resin material.

3. The acoustic wave device according to claim 2, wherein the metal material includes a material containing copper as a main component.

4. The acoustic wave device according to claim 2, wherein the resin material includes a photosensitive resin.

5. The acoustic wave device according to claim 4, wherein the photosensitive resin includes photosensitive polyimide.

6. The acoustic wave device according to claim 1, further comprising a protective film that is disposed on the first principal surface of the piezoelectric substrate and covers the IDT electrode.

7. The acoustic wave device according to claim 6, wherein the protective film includes at least one material selected from a group consisting of silicon oxide, a material containing silicon oxide as a main component, silicon nitride, a material containing silicon nitride as a main component, silicon oxynitride, and a material containing silicon oxynitride as a main component.

8. The acoustic wave device according to claim 1 further comprising a characteristics adjustment film that is disposed on the second principal surface of the piezoelectric substrate to adjust characteristics of the acoustic wave device.

9. The acoustic wave device according to claim 8, wherein the characteristics adjustment film includes at least one material selected from a group consisting of silicon oxide, a material containing silicon oxide as a main component, silicon nitride, a material containing silicon nitride as a main component, silicon oxynitride, and a material containing silicon oxynitride as a main component.

10. The acoustic wave device according to claim 9, wherein a main component of the characteristics adjustment film is the same as a main component of the protective film.

11. The acoustic wave device according to claim 10, wherein a composition of the characteristics adjustment film is the same as a composition of the protective film.

12. The acoustic wave device according to claim 1, wherein a portion of the sealing material extends to a bottom surface of the recess.

13. The acoustic wave device according to claim 1, wherein a plurality of the at least one through-holes is provided and a portions of the sealing material extend through the plurality of the at least one through-holes to couple with each other on a bottom surface of the recess.

* * * * *